US012658405B2

(12) United States Patent
Nomura et al.

(10) Patent No.: US 12,658,405 B2
(45) Date of Patent: Jun. 16, 2026

(54) CHARGED PARTICLE BEAM WRITING METHOD AND CHARGED PARTICLE BEAM WRITING APPARATUS

(71) Applicant: NuFlare Technology, Inc., Yokohama (JP)

(72) Inventors: Haruyuki Nomura, Yokohama (JP); Takahito Nakayama, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 370 days.

(21) Appl. No.: 18/053,135

(22) Filed: Nov. 7, 2022

(65) Prior Publication Data

US 2023/0102923 A1 Mar. 30, 2023

Related U.S. Application Data

(63) Continuation of application No. PCT/JP2021/015025, filed on Apr. 9, 2021.

(30) Foreign Application Priority Data

May 12, 2020 (JP) ................................. 2020-083979

(51) Int. Cl.
 *H01J 37/304* (2006.01)
 *G03F 7/20* (2006.01)
 (Continued)

(52) U.S. Cl.
 CPC ........ *H01J 37/3045* (2013.01); *G03F 7/2059* (2013.01); *H01J 37/244* (2013.01);
 (Continued)

(58) Field of Classification Search
 CPC .. H01J 37/3045; H01J 37/244; H01J 37/3174; H01J 37/10; H01J 37/1472;
 (Continued)

(56) References Cited

U.S. PATENT DOCUMENTS 5,912,468 A * 6/1999 Hirano ................... B82Y 40/00
 250/398
7,977,632 B2 7/2011 Todokoro et al.
 (Continued)

FOREIGN PATENT DOCUMENTS

CN 101546135 A 9/2009
JP 6-232032 A 8/1994
 (Continued)

OTHER PUBLICATIONS

Korean Office Action issued on Aug. 21, 2024 in Korean Application No. 10-2022-7020324, 14 pages (with unedited computer generated English translation).
 (Continued)

*Primary Examiner* — Robert H Kim
*Assistant Examiner* — Laura Eloise Tandy
(74) *Attorney, Agent, or Firm* — Oblon, McClelland, Maier & Neustadt, L.L.P.

(57) ABSTRACT

The purpose of the present invention is to correct a beam irradiation position shift caused by charging phenomena with high accuracy. A charged particle beam writing method includes virtually dividing a writing region of the substrate so as to have a predetermined mesh size and calculating a pattern density distribution representing an arrangement ratio of the pattern for each mesh region, calculating a dose distribution using the pattern density distribution, calculating an irradiation amount distribution using the pattern density distribution and the dose distribution, calculating a fogging charged particle amount distribution, calculating a charge amount distribution due to direct charge and a charge amount distribution due to fogging charge, calculating a position shift of a writing position based on the charge amount distribution due to direct charge and the charge amount distribution due to fogging charge, correcting an
 (Continued)

irradiation position using the position shift, and irradiating the corrected irradiation position with the charged particle beam with which a potential of a surface of the substrate becomes higher than a potential of a bottom surface of ae potential regulation member.

7 Claims, 4 Drawing Sheets

(51) Int. Cl.

| | |
|---|---|
| *H01J 37/09* | (2006.01) |
| *H01J 37/10* | (2006.01) |
| *H01J 37/147* | (2006.01) |
| *H01J 37/20* | (2006.01) |
| *H01J 37/21* | (2006.01) |
| *H01J 37/244* | (2006.01) |
| *H01J 37/302* | (2006.01) |
| *H01J 37/305* | (2006.01) |
| *H01J 37/317* | (2006.01) |

(52) U.S. Cl.
CPC ........... *H01J 37/3174* (2013.01); *H01J 37/10* (2013.01); *H01J 37/1472* (2013.01); *H01J 37/21* (2013.01); *H01J 2237/20221* (2013.01); *H01J 2237/24507* (2013.01); *H01J 2237/24578* (2013.01)

(58) Field of Classification Search
CPC ............. H01J 37/21; H01J 2237/20221; H01J 2237/24507; H01J 2237/24578; H01J 2237/31764; H01J 2237/31776; H01J 37/3026; H01J 37/09; H01J 37/147; H01J 37/20; H01J 37/305; G03F 7/2059; G03F 7/2061
See application file for complete search history.

(56) References Cited

U.S. PATENT DOCUMENTS

| | | | |
|---|---|---|---|
| 8,129,698 B2 | 3/2012 | Nakayamada et al. | |
| 8,178,856 B2 | 5/2012 | Nakayamada et al. | |
| 10,410,830 B2 | 9/2019 | Nakayamada | |
| 2015/0270101 A1 | 9/2015 | Iizuka | |
| 2016/0284509 A1* | 9/2016 | Matsumoto | ......... H01J 37/3026 |
| 2018/0090299 A1* | 3/2018 | Nakayamada | ...... H01J 37/3026 |
| 2019/0096632 A1* | 3/2019 | Ogasawara | ........... H01J 37/141 |
| 2019/0393014 A1* | 12/2019 | Kawamoto | ............. H01J 37/20 |

FOREIGN PATENT DOCUMENTS

| | | |
|---|---|---|
| JP | 2000-182942 A | 6/2000 |
| JP | 2000-200579 A | 7/2000 |
| JP | 2009-260250 A | 11/2009 |
| JP | 2011-40450 A | 2/2011 |
| JP | 2014-38945 A | 2/2014 |
| JP | 2015-179735 A | 10/2015 |
| JP | 2018-133552 A | 8/2018 |
| KR | 10-2018-0035177 A | 4/2018 |

OTHER PUBLICATIONS

International Search Report issued Jul. 6, 2021 in PCT/JP2021/015025 filed Apr. 9, 2021 (with English Translation), 6 pages.
Japanese Office Action issued Sep. 26, 2023 in Japanese Patent Application No. 2020-083979 (with unedited computer-generated English Translation), 10 pages.
Combined Chinese Office Action and Search Report issued Feb. 13, 2025 in Chinese Patent Application No. 202180010020.5 (with English Translation of Category of Cited Documents), 9 pages.

* cited by examiner

FIG.7a
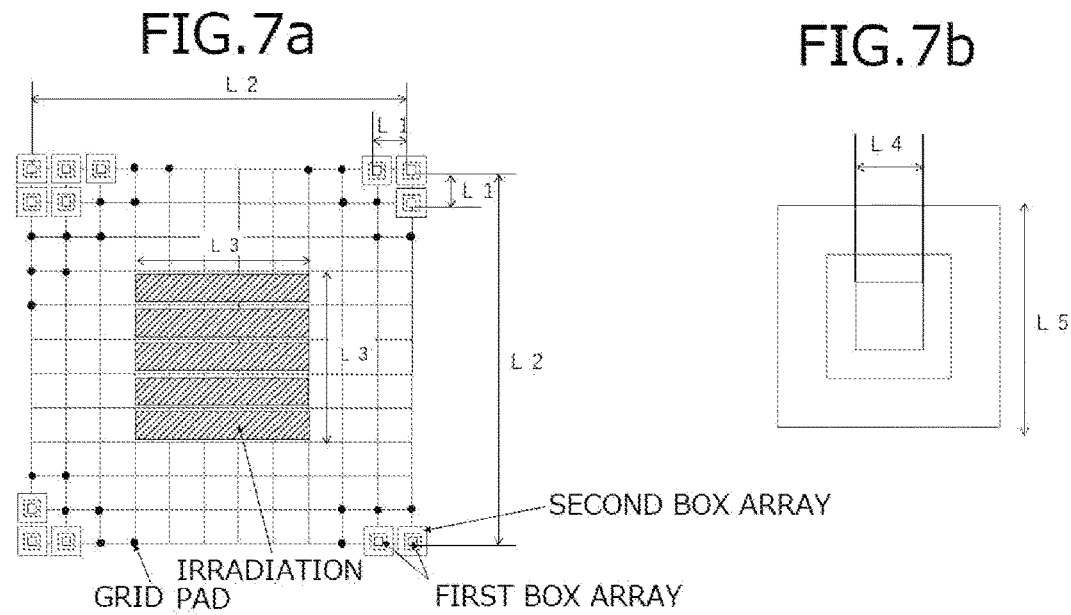
SECOND BOX ARRAY
IRRADIATION
GRID PAD        FIRST BOX ARRAY
FIG.7b
FIG.8a        FIG.8b        FIG.8c
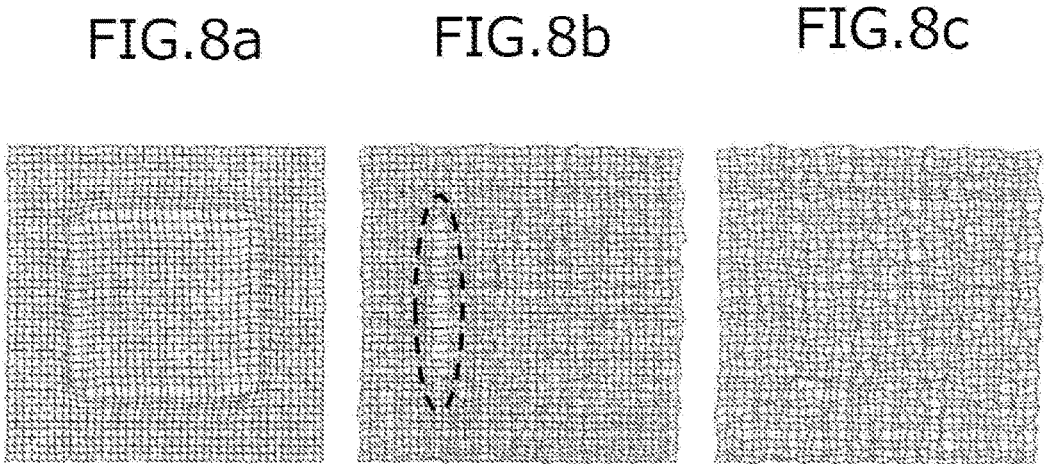
FIG.9
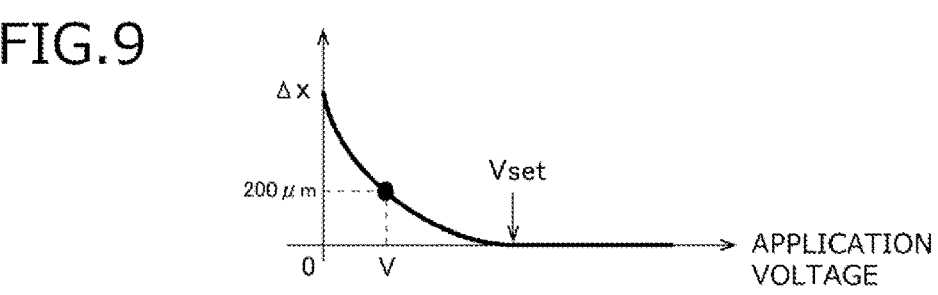

CHARGED PARTICLE BEAM WRITING METHOD AND CHARGED PARTICLE BEAM WRITING APPARATUS

FIELD

The present invention relates to a charged particle beam writing method and a charged particle beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In a case where a substrate such as a mask is irradiated with an electron beam, an irradiation position and its surrounding region are charged by electron beam irradiation performed in the past, and the irradiation position is shifted. Hitherto, as a method for eliminating this beam irradiation position shift, a method is known in which the surface of a substrate is prevented from being charged by forming an antistatic film (a charge dissipation layer (CDL)) on the substrate. However, this antistatic film basically has acid characteristics and thus is not suitable for, for example, a case where a chemically amplified resist is applied onto the substrate. Moreover, new facilities need to be provided to form an antistatic film, thereby further increasing the manufacturing cost. Therefore, it is desired that charging effect correction (CEC) be performed without using an antistatic film.

Charge of the surface of the substrate includes direct charge, fogging charge, and low energy fogging charge. The direct charge is caused by an electron beam with which irradiation is performed. The fogging charge is caused by scattered electrons falling down onto the substrate, the scattered electrons being electrons scattered in a writing space. The low energy fogging charge is caused by low energy secondary electrons falling down onto the substrate, the low energy secondary electrons being generated by performing beam irradiation on the substrate. A method for reducing the effect of fogging charge is being studied, in which an electrode that performs dynamic focusing is caused to have a positive potential to prevent secondary electrons from returning to the surface of the substrate. However, when the electrode that performs dynamic focusing is set to have a positive potential, the number of secondary electrons entering the column increases. This may cause contamination or cause formation of a space having a high negative potential due to electrons trapped in the magnetic field of a magnetic field lens, so that the trajectory of an electron beam is affected. Consequently, there is a problem in that the accuracy of writing decreases.

PTL 1: JPH06-232032A
PTL 2: JP2000-200579A
PTL 3: JP2000-182942A

SUMMARY OF INVENTION

The present invention aims to provide a charged particle beam writing method and a charged particle beam writing apparatus that correct, with high accuracy, a beam irradiation position shift caused by charging phenomena.

According to one aspect of the present invention, in a charged particle beam writing method, a charged particle beam is deflected by a deflector, focusing is performed by an objective lens, and a pattern is written on a substrate on a stage. The charged particle beam writing method includes virtually dividing a writing region of the substrate so as to have a predetermined mesh size and calculating a pattern density distribution representing an arrangement ratio of the pattern for each mesh region, calculating a dose distribution representing a dose for each mesh region using the pattern density distribution, calculating an irradiation amount distribution of the charged particle beam irradiated to the substrate using the pattern density distribution and the dose distribution, calculating a fogging charged particle amount distribution by convolving a distribution function for fogging charged particles with the irradiation amount distribution, calculating a charge amount distribution due to direct charge using the pattern density distribution, the dose distribution, and the irradiation amount distribution, and calculating a charge amount distribution due to fogging charge using the fogging charged particle amount distribution, calculating a position shift of a writing position based on the charge amount distribution due to direct charge and the charge amount distribution due to fogging charge, correcting an irradiation position using the position shift, and forming an electric field by applying a predetermined voltage to at least one of the substrate and a potential regulation member such that a potential of a surface of the substrate becomes higher than a potential of a bottom surface of the potential regulation member arranged at a position facing the substrate, and irradiating the corrected irradiation position with the charged particle beam.

According to one aspect of the present invention, a charged particle beam writing apparatus causes a deflector to deflect a charged particle beam, performs focusing using an objective lens, and writes a pattern on a substrate on a stage. The charged particle beam writing apparatus includes a discharger discharging the charged particle beam, a pattern density distribution calculator virtually dividing a writing region of the substrate in a mesh-like manner and calculating a pattern density distribution representing an arrangement ratio of the pattern for each mesh region, a dose distribution calculator calculating a dose distribution representing a dose for each mesh region using the pattern density distribution, an irradiation amount distribution calculator calculating an irradiation amount distribution of the charged particle beam discharged from the discharger and irradiated to the substrate using the pattern density distribution and the dose distribution, a fogging charged particle amount distribution calculator calculating a fogging charged particle amount distribution by convolving a distribution function for fogging charged particles with the irradiation amount distribution, a charge amount distribution calculator calculating a charge amount distribution due to direct charge using the pattern density distribution, the dose distribution, and the irradiation amount distribution, and calculating a charge amount distribution due to fogging charge using the fogging charged particle amount distribution, a position shift distribution calculator calculating, for writing positions, a position shift of each writing position based on the charge amount distribution due to direct charge and the charge amount distribution due to fogging charge, a corrector correcting an irradiation position using the position shift, a potential regulation member that is arranged at a position facing the substrate and is controlled to have a predetermined potential, a voltage control circuit forming an electric field directed from the substrate toward the objective lens by applying a predetermined voltage to at least one of the substrate and the potential regulation member such that a potential of a surface of the substrate becomes higher than a potential of a bottom surface of the potential regulation member, and a writer irradiating the corrected irradiation position with the charged particle beam in a state where the electric field is formed.

Advantageous Effects of Invention

According to the present invention, a beam irradiation position shift caused by charging phenomena can be corrected with high accuracy.

BRIEF DESCRIPTION OF DRAWINGS

FIGS. 7a and 7b are diagrams illustrating an example of an evaluation pattern.

FIGS. 8a, 8b, and 8c are diagrams illustrating position shift distributions.

FIG. 9 is a graph illustrating the relationship between application voltage and writing position shift.

DESCRIPTION OF EMBODIMENTS

Hereinafter, an embodiment of the present invention will be described based on the drawings. In the present embodiment, a configuration will be described, which uses an electron beam as an example of a charged particle beam. However, the charged particle beam is not limited to an electron beam, and may be an ion beam or the like.

Figure 1:
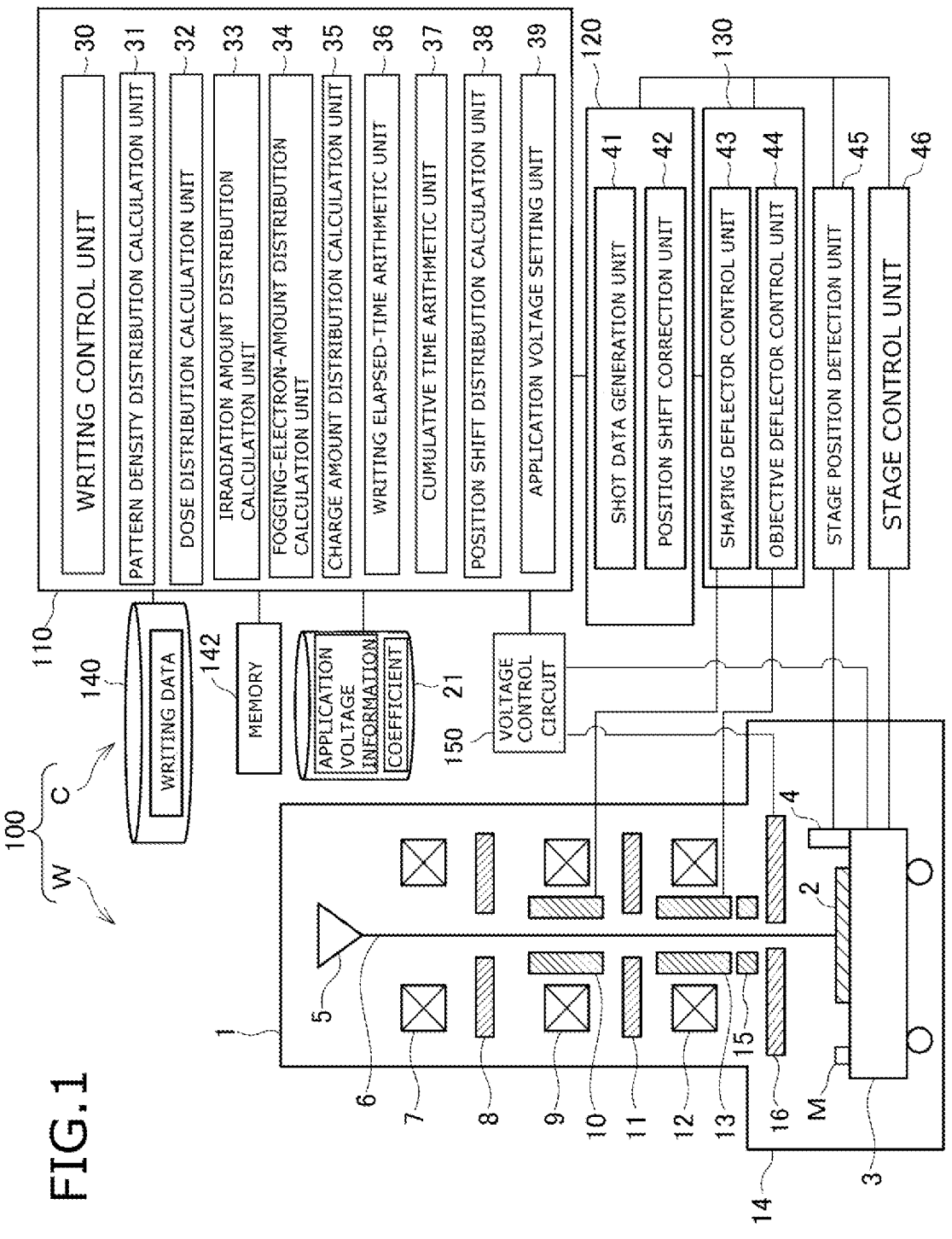
FIG. 1 is a schematic diagram of a writing apparatus according to an embodiment of the present invention.

FIG. 1 is a schematic configuration diagram of a writing apparatus according to an embodiment. A writing apparatus 100 illustrated in FIG. 1 includes a writing unit W and a control unit C. The writing apparatus 100 is an example of an electron beam writing apparatus. The writing unit W has an electronic column 1 and a writing space 14. In the electronic column 1, an electron gun 5, an illumination lens 7, a first aperture 8, a projection lens 9, a shaping deflector 10, a second aperture 11, an objective lens 12, an objective deflector 13, an electrostatic lens 15, and a potential regulation member 16 are arranged.

In the writing space 14, an XY stage 3 is arranged. A substrate 2, which is a writing target, is arranged on the XY stage 3. The substrate 2 includes, for example, a photomask used for exposure in semiconductor manufacturing and a semiconductor wafer for forming a semiconductor device. In addition, a photomask on which writing is to be performed includes a mask blank, on which nothing has been written yet. In a case where writing is to be performed, a resist layer that is photosensitive to an electron beam is formed on the substrate. On the XY stage 3, a mirror 4 for stage position measurement is arranged at a different position from the position where the substrate 2 is arranged.

On the XY stage 3, a mark M for calibration is provided at a different position from the position where the substrate 2 is arranged. For example, the mark M is made of metal and has a cross shape. Focus adjustment, position adjustment, deflection shape correction coefficient adjustment, and the like are performed by scanning the mark M using an electron beam and detecting reflected electrons from the mark M using a detector (not illustrated).

The control unit C has, for example, control calculators 110 and 120, a stage position detection unit 45, a stage control unit 46, a deflection control circuit 130, a memory 142, storage devices 21 and 140 such as a magnetic disk device, and a voltage control circuit 150. The deflection control circuit 130 is connected to the shaping deflector 10 and the objective deflector 13.

The voltage control circuit 150 is connected to at least one out of the stage 3 and the potential regulation member 16, which is arranged so as to face the substrate. The voltage control circuit 150 can control a voltage applied to the substrate 2 placed on the stage 3.

Figure 2:
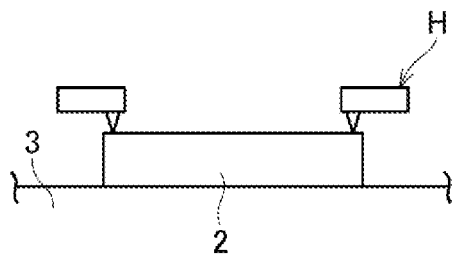
FIG. 2 is a diagram illustrating a cover for covering the periphery of a substrate.

For example, as illustrated in FIG. 2, a frame-like cover H having electrical conductivity is provided on the stage 3 so as to cause the substrate 2 to have a certain potential. The cover H covers a peripheral portion of the substrate 2 and serves as a shield for an electric field from an irradiation electron beam, the electric field being generated by the side surfaces of the substrate being charged. Pins protrude from the bottom surface of the cover H, and these pins are in contact with the substrate 2. The voltage control circuit 150 can apply a desired voltage to the substrate 2 via this cover H.

In addition, the voltage control circuit 150 can apply a desired voltage to the potential regulation member 16, which is arranged so as to face the substrate. The potential regulation member 16 is an electrically conductive member and is provided directly above the substrate 2 with a predetermined gap therebetween. For example, the potential regulation member 16 may be a reflected-electron prevention plate provided to make it less likely that electrons reflected from the top plate of the writing space are incident on the substrate again. The potential regulation member 16 may be a heat shield that prevents heat generated by excitation of the objective lens from being transferred to the substrate due to radiation. Alternatively, the potential regulation member 16 may be an electrode included in an electrostatic lens at the bottom stage of the electron-optical system or a structural member for supporting the electrode.

The control calculator 110 has the functions of a writing control unit 30, a pattern density distribution calculation unit 31, a dose distribution calculation unit 32, an irradiation amount distribution calculation unit 33, a fogging-electron-amount distribution calculation unit 34, a charge amount distribution calculation unit 35, a writing elapsed-time arithmetic unit 36, a cumulative time arithmetic unit 37, a position shift distribution calculation unit 38, and an application voltage setting unit 39. Each unit of the control calculator 110 may be configured using hardware including, for example, an electric circuit, a computer, a processor, a circuit board, a quantum circuit, or a semiconductor device or may be configured using software. Data input to and calculation results from each unit of the control calculator 110 are stored in the memory 142.

The control calculator 120 has the functions of a shot data generation unit 41 and a position shift correction unit 42.

The shot data generation unit 41 and the position shift correction unit 42 may be configured using software or hardware.

The deflection control circuit 130 has the functions of a shaping deflector control unit 43 and an objective deflector control unit 44. The shaping deflector control unit 43 and the objective deflector control unit 44 may be configured using software or hardware.

Writing data (layout data) in which a plurality of shape patterns to be written are defined is stored in the storage device 140.

An electron beam 6 emitted from the electron gun 5 (an emission unit) is caused to illuminate the entirety of the first aperture 8, which has a rectangular hole, by the illumination lens 7. In this case, first, the electron beam 6 is shaped so as to have a rectangular shape. The electron beam 6 of a first aperture image that has passed through the first aperture 8 is projected onto the second aperture 11 by the projection lens 9. The position of the first aperture image on the second aperture 11 is deflected by the shaping deflector 10 controlled by the shaping deflector control unit 43, so that the beam shape and size can be changed (variable shaping).

The electron beam 6 of a second aperture image that has passed through the second aperture 11 is focused on the objective lens 12, deflected by, for example, an electrostatic deflector (the objective deflector 13) controlled by the objective deflector control unit 44, and applied to a desired position on the substrate 2 on the XY stage 3, which is arranged so as to be movable. The XY stage 3 is driven and controlled by the stage control unit 46. The position of the XY stage 3 is detected by the stage position detection unit 45. The stage position detection unit 45 includes, for example, a laser length measurement device that irradiates the mirror 4 with laser to measure a position on the basis of the interference between incident light and reflected light. The electrostatic lens 15 dynamically corrects the focus position of the electron beam 6 in accordance with the roughness of the surface of the substrate 2 (dynamic focus).

Figure 3:
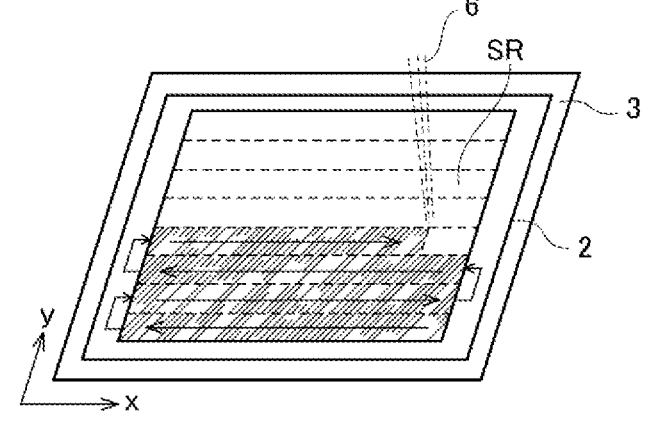
FIG. 3 is a diagram for describing the way in which a stage is moved.

FIG. 3 is a diagram for describing the way in which the stage is moved. In a case where writing is performed on the substrate 2, the XY stage 3 is continuously moved, for example, in the X direction. A writing region is virtually divided into a plurality of strip-shaped stripe regions (SR) having a width across which the electron beam 6 can be deflected. Writing processing is performed in units of stripe region. The XY stage 3 is, for example, continuously moved in the X direction, and the shot position of the electron beam 6 is simultaneously caused to track the stage movement. By causing the XY stage 3 to move continuously, a writing time can be shortened.

After writing in one stripe region is finished, the XY stage 3 is step fed in the Y direction, and a writing operation is performed in the next stripe region in the X direction (the opposite direction). The travel time of the XY stage 3 can be shortened by performing the writing operation on the individual stripe regions in a meandering manner.

In the writing apparatus 100, in order to process layout data (writing data), the writing region is virtually divided into a plurality of strip-shaped frame regions, and data processing is performed on a frame region basis. In a case where multiple exposures are not performed, normally, the frame regions are the same as the stripe regions. In a case where multiple exposures are performed, the frame regions and the stripe regions become misaligned in accordance with the number of exposures. In this manner, the writing region of the substrate 2 is virtually divided into the plurality of frame regions (stripe regions), which are a plurality of writing unit regions, and the writing unit W performs writing on a frame region (stripe region) basis.

It is known that when the resist layer of the substrate 2 is irradiated with an electron beam, the beam irradiation position is shifted due to the resist charging effect. In the present embodiment, in charging effect correction, a fogging electron amount distribution is calculated on the basis of an irradiation amount distribution of an electron beam with which the substrate 2 is to be irradiated and a spreading distribution of fogging electrons spreading from an irradiation range to be irradiated with the electron beam to a non-irradiation range, and a charge amount distribution of the irradiation range (direct charge) and a charge amount distribution of the non-irradiation range (fogging charge) are calculated using the irradiation amount distribution and the fogging electron amount distribution. A position shift distribution of the electron beam on the substrate 2 is then calculated from the charge amount distribution of the irradiation range and the charge amount distribution of the non-irradiation range, and the beam irradiation position is corrected.

Figure 4A:
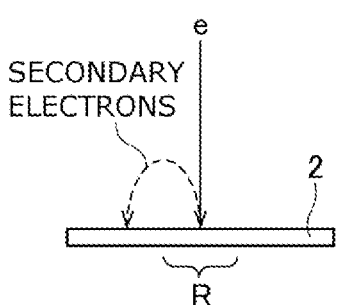
FIG. 4a is a diagram illustrating drift of a secondary electron.
Figure 4B:
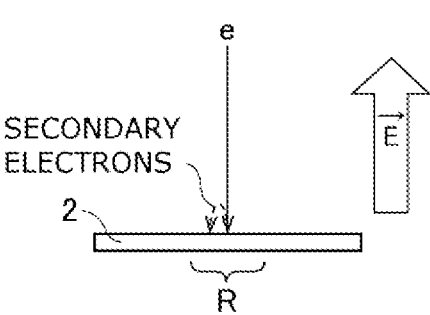
FIG. 4b is a schematic diagram of a state in which a secondary electron is pushed back by an electric field.

The inventors found that, as illustrated in FIG. 4a, secondary electrons having low energy among fogging electrons that contribute to charging drift to a place apart from the beam irradiation position due to the fringing magnetic field or the fringing electric field directed from the electron-optical system to the writing space and perform charging, and thus the spreading distribution is beyond an irradiation range R of the electron beam, thereby reducing the effect of correction of the beam irradiation position. Furthermore, the inventors found that, as illustrated in FIG. 4b, charging performed by the secondary electrons having low energy can be treated in the same manner as "direct charging" by causing the secondary electrons to be actively pushed back to the irradiation range R by the electric field directed from the substrate 2 toward the potential regulation member 16 such that the secondary electrons charge positions in the irradiation range R, and thus beam irradiation position shifts can be corrected with high accuracy.

In the present embodiment, in order to form the electric field directed from the substrate 2 toward the potential regulation member 16, a voltage is applied to the potential regulation member 16, the substrate, or both such that the potential of the substrate becomes higher than the potential of the bottom surface of the potential regulation member 16. For example, the voltage control circuit 150 applies a voltage such that the substrate 2 has a positive potential or the bottom surface of the potential regulation member 16 has a negative potential.

Figure 5:
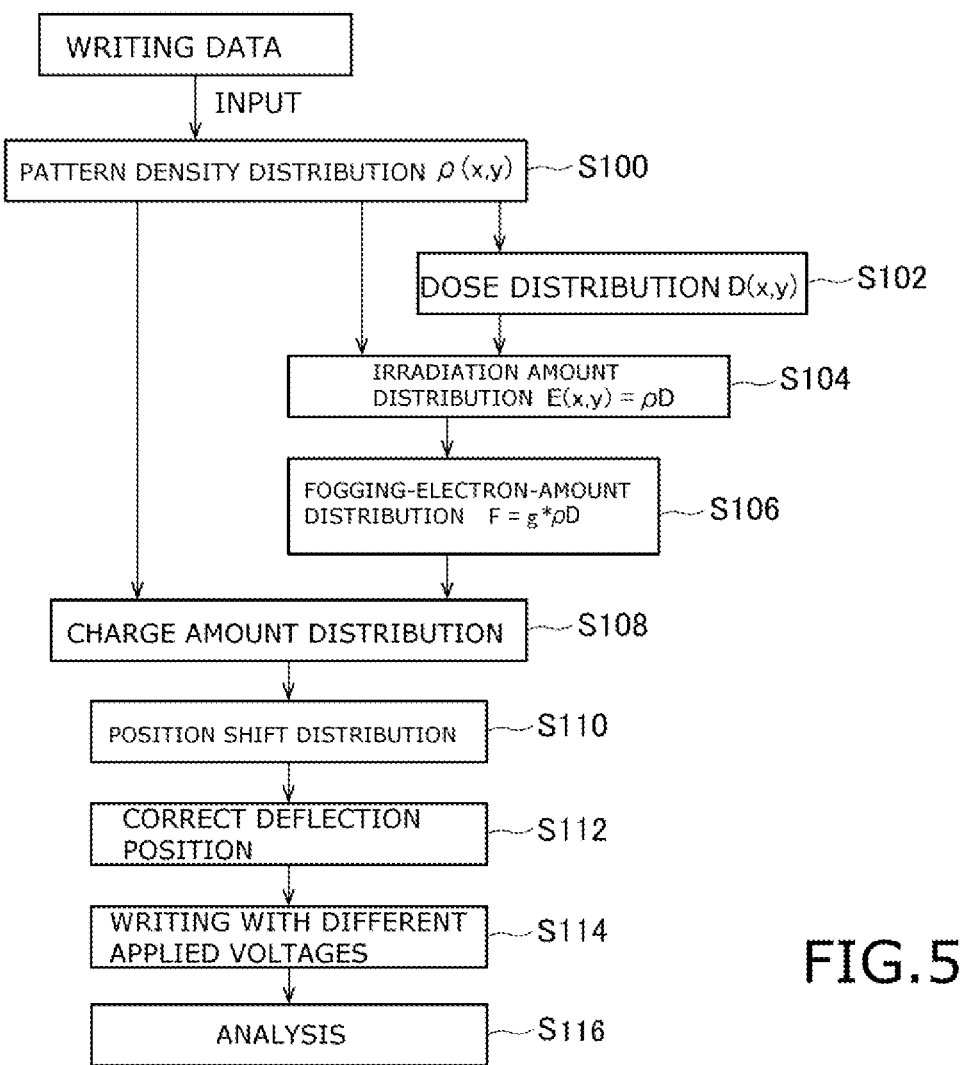
FIG. 5 is a flow chart for describing an application voltage determination method according to the embodiment.

FIG. 5 is a flow chart for describing an application voltage determination method according to the present embodiment, the method being a method for determining the application voltage to the potential regulation member 16, the substrate, or both. This method has a pattern density distribution arithmetic step (step S100), a dose distribution calculation step (step S102), an irradiation amount distribution calculation step (step S104), a fogging-electron-amount distribution calculation step (step S106), a charge amount distribution calculation step (step S108), a position shift distribution calculation step (step S110), a deflection position correction step (step S112), a writing step (step S114), and an analysis step (step S116).

In the pattern density distribution arithmetic step (step S100), the pattern density distribution calculation unit 31 reads out writing data of an evaluation pattern from the storage device 140, virtually divides the writing region (or the frame regions) in a mesh-like manner so as to have a predetermined mesh size (grid dimensions), and calculates, on a mesh region basis (a charging effect correction mesh region basis), a pattern density ρ representing the arrangement ratio of a shape pattern defined in the writing data. A pattern density distribution ρ(x, y) on a mesh region basis is then generated.

In the dose distribution calculation step (step S102), the dose distribution calculation unit 32 calculates a dose distribution D(x, y) on a mesh region basis using the pattern density distribution ρ(x, y). To calculate a dose, it is preferable that proximity effect correction based on backscattered electrons be performed. A dose D can be defined by the following Eq. (1).

$$D = D_0 \times \{(1 + 2 \times \eta) / (1 + 2 \times \eta \times \rho)\} \tag{1}$$

In Eq. (1), $D_0$ is a standard dose, and n is a back-scattering rate.

The standard dose $D_0$ and the back-scattering rate n are set by the user of the writing apparatus 100. The back-scattering rate n can be set by considering, for example, an acceleration voltage for the electron beam 6, the thickness of a resist film of the substrate 2, the type of base substrate, and process conditions (for example, post exposure bake (PEB) conditions or development conditions).

In the irradiation amount distribution calculation step (step S104), the irradiation amount distribution calculation unit 33 calculates an irradiation amount distribution E(x, y) (also referred to as an "irradiation intensity distribution") on a mesh region basis by multiplying each mesh value of the pattern density distribution ρ(x, y) by a corresponding mesh value of the dose distribution D(x, y).

In the fogging-electron-amount distribution calculation step (step S106), the fogging-electron-amount distribution calculation unit 34 (a fogging charged particle amount distribution arithmetic unit) calculates a fogging electron amount distribution F (a fogging charged particle amount distribution) by convolving a distribution function g of fogging electrons with the irradiation amount distribution E=ρD calculated in step S104. For the distribution function g of fogging electrons, for example, a Gaussian distribution can be used.

A distribution function g(x, y) and a fogging electron amount distribution F(x, y) can be individually defined by the following equations.

$$g(x, y) = (1 / n\sigma^2) \times \exp[-\{x^2 + y^2\} / \sigma^2] \tag{2}$$

$$F(x, y) = \int\int g(x, y) E(x', y') dx' dy' \tag{3}$$

In Eq. (2), σ is a constant representing the radius affected by fogging electrons.

In the charge amount distribution calculation step (step S108), the charge amount distribution calculation unit 35 calculates a charge amount distribution C(x, y) using the irradiation amount distribution E, the fogging electron amount distribution F, and a charge decay amount over time.

First, an elapsed time t after writing (irradiation) was performed on a charged portion is calculated. The writing elapsed-time arithmetic unit 36 calculates, for each position on the substrate 2, an elapsed time T1(x, y) from a writing start time (a time when writing of the start of the layout or the top frame is started) to a time when writing is actually started. For example, in a case where a subject frame region (stripe region) is the i-th frame region, a time estimated from the writing start time, at which writing at a writing start position is started, to when writing is performed at each position (x, y) in the (i-1)-th frame region (stripe region), which is the previous frame, is calculated as an elapsed time T1(x, y).

Next, the cumulative time arithmetic unit 37 calculates a cumulative time T2 obtained by accumulating writing times spent to perform writing in writing unit regions (for example, frame regions, stripe regions) in which writing has already been finished. For example, in a case where currently the subject frame region is the i-th frame region, an addition value is calculated that is obtained by adding, in a cumulative manner, a time T2(1) for performing writing in the first frame region, a time T2(2) for performing writing in the second frame region, . . . , and a time T2(i) for performing writing in the i-th frame region. As a result, the cumulative time T2 to the subject frame region can be obtained.

Here, in a case where writing is to be actually performed in the currently processed subject frame region, since writing has already been completed in the frame regions up to the previous frame region, portions irradiated with the electron beam 6 in the frame regions up to the previous frame region are charged portions. Thus, a difference value (T2-T1) obtained by subtracting the writing elapsed time T1(x, y) of each position (x, y) up to the previous frame region having charged portions from the cumulative time T2 of the subject frame region is the elapsed time t after performance of writing in the corresponding charged portion.

A function for obtaining a charge amount distribution C(x, y) includes a direct charge term, to which irradiation electrons contribute, and a fogging charge term, to which fogging electrons contribute. Each of the direct charge term and the fogging charge term includes a decay term, to which the elapsed time contributes, and a static term, to which the elapsed time does not contribute. In each of the decay terms, a charge decay amount and a charge decay time constant are used, the charge decay amount being a charge amount obtained immediately after performance of writing with reference to a charge amount obtained after a sufficient time has elapsed after performance of writing.

First, a function C(E, F, t) for obtaining the charge amount distribution C(x, y) was assumed. Specifically, the function C(E, F, t) was separated into a variable $C_E(E, t)$, to which irradiation electrons contribute, and a variable $C_F(F, t)$, to which fogging electrons contribute. Furthermore, the variables were individually separated into decay terms $C_{ET}(t)$ and $C_{FT}(t)$, to which the elapsed time contributes, and static terms $C_{ES}(E)$ and $C_{FS}(F)$, to which the elapsed time does not contribute. The function C(E, F, t) is defined by the following Eq. (4).

$$C(x, y) = C(E, F, t) \tag{4}$$
$$= C_E(E, t) + C_F(F, t)$$
$$= C_{ES}(E) + C_{ET}(t) + C_{FS}(F) + C_{FT}(t)$$

Moreover, the variables $C_{ES}(E)$, $C_{ET}(t)$, $C_{FS}(F)$, and $C_{FT}(t)$ are defined by the following Eqs. (5), (6), (7), and (8).

$$C_{ES}(E) = d_0 + d_1 \times \rho + d_2 \times D + d_3 \times E \tag{5}$$

$$C_{ET}(t) = K_E(\rho) \cdot \exp\{-t/\lambda_E(\rho)\} \tag{6}$$

$$C_{FS}(F) = f_1 \times F + f_2 \times F^2 + f_3 \times F^3 \tag{7}$$

$$C_{FT}(t) = K_F(\rho) \cdot \exp\{-t/\lambda_F(\rho)\} \tag{8}$$

In this case, $d_0$, $d_1$, $d_2$, $d_3$, $f_1$, $f_2$, and $f_3$ are constants.

Moreover, charge decay amounts $\kappa_E(\rho)$ and $\kappa_F(\rho)$ used in Eqs. (6) and (8) and dependent on the pattern density $\rho$ can be approximated as, for example, the following Eqs. (9) and (10). In this case, Eqs. (9) and (10) are quadratic functions; however, the equations are not limited thereto and may be higher-order or lower-order functions.

$$\kappa_E(\rho) = \kappa_{E0} + \kappa_{E1}\rho + \kappa_{E2}\rho^2 \tag{9}$$

$$\kappa_F(\rho) = \kappa_{F0} + \kappa_{F1}\rho + \kappa_{F2}\rho^2 \tag{10}$$

In this case, $\kappa_{E0}$, $\kappa_{E1}$, $\kappa_{E2}$, $\kappa_{F0}$, $\kappa_{F1}$, and $\kappa_{F2}$ are constants.

Charge decay time constants $\lambda_E(\rho)$ and $\lambda_F(\rho)$ used in Eq. (4) and dependent on the pattern density $\rho$ can be approximated as, for example, the following Eqs. (11) and (12). In this case, Eqs. (11) and (12) are quadratic functions; however, the equations are not limited thereto and may be higher-order or lower-order functions.

$$\lambda_E(\rho) = \lambda_{E0} + \lambda_{E1}\rho + \lambda_{E2}\rho^2 \tag{11}$$

$$\lambda_F(\rho) = \lambda_{F0} + \lambda_{F1}\rho + \lambda_{F2}\rho^2 \tag{12}$$

Figure 6:
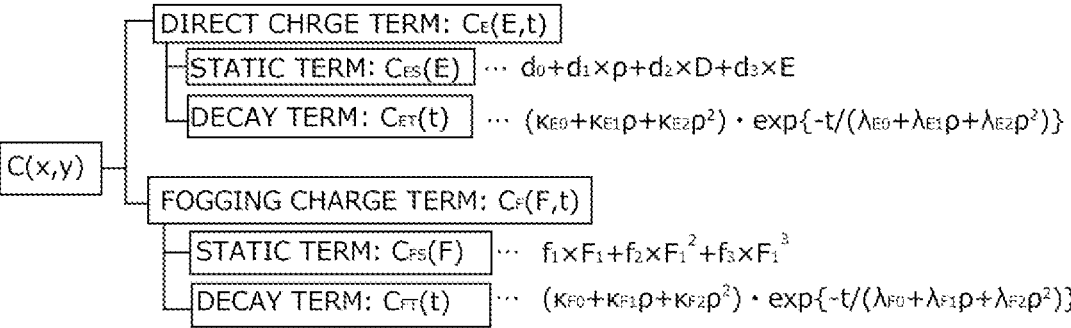
FIG. 6 is a diagram illustrating mathematical expressions described by generalizing a charge amount distribution.

In this case, $\lambda_{E0}$, $\lambda_{E1}$, $\lambda_{E2}$, $\lambda_{F0}$, $\lambda_{F1}$, and $\lambda_{F2}$ are constants. That is, the charge amount distribution $C(x, y)$ can be defined by expressions as illustrated in FIG. 6.

It is sufficient that coefficients of Eqs. (2), (3), (5), (7), and (9) to (12) be obtained by fitting (approximating) experimental results, simulation results, or both. Data regarding these coefficients is stored in the storage device 21.

In the position shift distribution calculation step (step S110), the position shift distribution calculation unit 38 (a position shift calculation unit) calculates a position shift based on the charge amount distribution. Specifically, the position shift distribution calculation unit 38 calculates a position shift P of a writing position (x, y) due to the charge amount at each position (x, y) of the charge amount distribution $C(x, y)$ by convolving the charge amount distribution calculated in step S108 with a response function $r(x, y)$.

Suppose that the response function $r(x, y)$ converts this charge amount distribution $C(x, y)$ into a position shift distribution $P(x, y)$. In this case, a charge position represented by each position of the charge amount distribution $C(x, y)$ is expressed as $(x', y')$, and a beam irradiation position of a subject frame region (for example, the i-th frame region) on which data processing is currently performed is expressed as $(x, y)$. In this case, a beam position shift can be expressed as a function of the distance from a beam irradiation position $(x, y)$ to a charge position $(x', y')$, and thus the response function can be described as $r(x-x', y-y')$. It is sufficient that the response function $r(x-x', y-y')$ be obtained in advance so as to match results of experiments performed in advance or be obtained in advance through a numerical calculation. In the following, $(x, y)$ represents a beam irradiation position of the subject frame region on which data processing is currently performed.

The position shift distribution calculation unit 38 then generates a position shift distribution Pi(x, y) (or also referred to as a position shift map Pi(x, y)) from the position shift P of each position (x, y), which is a writing target, in the subject frame region. The calculated position shift map Pi(x, y) is stored in the storage device 21 and also output to the control calculator 120.

In contrast, in the control calculator 120, the shot data generation unit 41 reads out the writing data from the storage device 140 and generates shot data in a format unique to the writing apparatus 100 by performing multistage data conversion processing. The size of a shape pattern defined in the writing data is normally larger than the shot size that can be formed in one shot by the writing apparatus 100. Thus, in the writing apparatus 100, each shape pattern is divided into a plurality of shot shapes so as to have a size that can be formed in one shot by the writing apparatus 100 (shot division). For each shot shape, data such as a shape code representing the shape type, coordinates, and the size are defined as shot data.

In the deflection position correction step (step S112) (a position shift correction step), the position shift correction unit 42 corrects the irradiation position using the position shift calculated in step S110. In this case, the shot data for each position is corrected. Specifically, to the shot data for each position (x, y), a correction value for correcting the position shift represented by the position shift map Pi(x, y) is added. It is preferable that, for example, a value obtained by inverting the positive/negative sign of the position shift represented by the position shift map Pi(x, y) be used as the correction value. As a result, in a case where irradiation with the electron beam 6 is to be performed, the coordinates of the irradiation destination are corrected, and thus the deflection position to which the beam is deflected by the objective deflector 13 is corrected. Pieces of shot data are defined in a data file such that the pieces of shot data are sorted in shot order.

In the writing step (step S114), in shot order, the shaping deflector control unit 43 in the deflection control circuit 130 calculates, for each shot shape, the amount of deflection of the shaping deflector 10 for changing the shape of the electron beam 6, the amount of deflection being calculated from the shape type and size defined in the shot data. Moreover, the objective deflector control unit 44 calculates the amount of deflection of the objective deflector 13 for deflecting the shot shape to an irradiation position on the substrate 2. In other words, the objective deflector control unit 44 (a deflection amount arithmetic unit) calculates the amount of deflection for deflecting the electron beam to the corrected irradiation position. The objective deflector 13 arranged in the electronic column 1 then deflects the electron beam in accordance with the calculated amount of deflection to irradiate the corrected irradiation position with the electron beam. As a result, the writing unit W writes the evaluation pattern at a certain position on the substrate 2, the position being determined as a result of charge correction.

FIGS. 7a and 7b are diagrams illustrating an example of the evaluation pattern. Note that FIGS. 7a and 7B are illustrated at different respective scales in order to clearly illustrate details. Regarding a test layout illustrated in FIG. 7a, a first box array is written in which the boxes are provided with a pitch L1, which is 200 μm, and on a grid (81×81 grid) with sides having a length of L2, which is 20 mm. Thereafter, an irradiation pad with sides having a length of L3, which is 10 mm, and with a pattern density of 100% is written in the center of the test layout, and furthermore, a second box array is written on the same grid for the first box array. As a result, the test layout can be obtained.

As illustrated in FIG. 7b in an enlarged manner, the first box array has, for example a pattern formed by squares each with sides having a length of L4, which is 4 μm. The second box array has, for example, a pattern formed by frame-like shapes each with sides having a length of L5, which is 14 μm, having a size greater than that of the first box array, and having a hollow in the center. Position shifts due to the charging effect of the irradiation pad are obtained by measuring the positions of the written first and second box arrays described above and subtracting the position of the first box array from the position of the second box array.

The evaluation pattern is written a plurality of times by changing the voltage applied to the potential regulation member 16, the substrate, or both. As a result, charging effect correction is involved, and a plurality of evaluation patterns for which the intensities of the electric fields directed from the substrate 2 toward the objective lens 12 (the potential regulation member 16) are different from each other at the time of writing are written on the substrate 2.

FIG. 8a illustrates a position shift distribution obtained using the evaluation pattern described above. In this case, as described above, secondary electrons having low energy drift to a place apart from the beam irradiation position due to the fringing magnetic field or the fringing electric field directed from the electron-optical system to the writing space and perform charging, and thus the spreading distribution is beyond an irradiation range R of the electron beam (low energy fogging charge), thereby reducing the effect of correction of the beam irradiation position.

FIG. 8b illustrates a position shift distribution after performance of evaluation pattern charging effect correction at an application voltage V. Due to the effect of low energy fogging charge, as encircled with a broken line, this indicates that correction residuals have occurred at an end of the irradiation region. In this case, a low energy fogging charge distribution CL(L) is taken into consideration in the analysis step (step S116). L denotes a low energy fogging electron amount distribution. A charge amount distribution C(x, y) can be expressed as follows obtained by adding CL(L) to Eq. (4).

$$C(x, y) = C(E, F, t) + CL(L) \tag{13}$$

Moreover, a low energy fogging electron amount distribution L(x, y) and a low energy fogging electron distribution function gL(x, y) can be defined by the following respective equations.

$$gL(x, y) = (1/\sqcap \sigma L2) \times \exp[-\{(x - \Delta x)^2 + (y - \Delta y)^2\}/\sigma L2] \tag{14}$$

$$L(x, y) = \int\int g(x, y)E(x', y')dx'dy' \tag{15}$$

In this case, Δx and Δy are constants representing shifts by which low energy fogging electrons are shifted from the beam irradiation position due to the fringing magnetic field or the fringing electric field directed from the electron-optical system to the writing space.

The variable CL(L) is defined by the following equation.

$$CL(L) = l1 \times L + l2 \times L2 + l3 \times L3 \tag{16}$$

In this case, I1, I2, and I3 are constants.

Furthermore, an additional correction amount distribution calculated from the charge distribution expressed by Eqs. (13) to (16) is applied to the position shift map obtained after performance of charging effect correction (see FIG. 8b), and I1, I2, I3, Δx, and Δy with which the correction residuals are minimized can be determined.

FIG. 8c illustrates a position shift distribution after performance of additional correction in which a low energy fogging charge distribution with the shifted central distribution is assumed and I1, I2, I3, Δx, and Δy are optimized such that the correction residuals regarding FIG. 8b are minimized. As a result, as in the relationship between the application voltage and Δx illustrated in FIG. 9, the shifts of the central distribution are determined to be Δx=200 μm and Δy=0 μm.

Δx obtained from the result described above represents a shift from the irradiation position of a low energy fogging electron; however, Δx is a value optimized with respect to the evaluation pattern described above, and a low energy fogging electron is not always shifted by Δx with respect to a freely chosen actual writing pattern (a product pattern) to perform charging. Specifically, by receiving the effect of the electric field generated by the region charged through writing that has already been performed, the shift may be increased or reduced depending on the writing pattern. Thus, regarding a freely chosen writing pattern, in a case where only charging effect correction taking Eq. (13) into consideration is performed, correction residuals occur.

In the present embodiment, in the analysis step (step S116), a writing result of the evaluation pattern is analyzed, and the relationship between the application voltage and the position shift from the design position of the writing pattern is obtained. For example, as illustrated in FIG. 9, the relationship between the voltage applied to the substrate and the position shift Δx can be obtained. In a case where the application voltage is low, secondary electrons drift due to the effect of, for example, the fringing magnetic field and charge positions apart from a direct charge region. Thus, for example, Δx has a value of 1 mm to several hundred μm. When the application voltage is sufficiently increased, the charge positions of the secondary electrons become closer to the direct charge region, and the correction residuals gradually decrease. When the position shift Δx becomes sufficiently small (for example, less than or equal to one tenth of the size of a charging effect correction mesh), for example, Δx=0, and an application voltage: Vset are obtained and stored, as application voltage information, in the storage device 21.

In writing of the product pattern (actual writing), writing data regarding the product pattern is read out from the storage device 140, and processing substantially the same as steps S100 to S112 of FIG. 5 is performed.

In this case, a shift of the center of the low energy fogging charge distribution from the irradiation position is always smaller than the charging effect correction mesh, and the low energy fogging charge distribution can be practically treated in the same manner as a direct charge distribution. Thus, regarding the freely chosen writing pattern (the product pattern), correction residuals due to the low energy fogging electrons can be eliminated.

In the embodiment described above, in a case where a voltage is applied to the substrate 2, it is preferable that a voltage be applied to the mark M such that the mark M has the same potential. As a result, between on the substrate 2 and on the mark M, differences in focus or deflected shape can be reduced.

Note that in a case where the difference in potential between the mark M and the substrate 2 is kept constant and a calibration difference (a focus difference, a deflected shape difference, or the like) is stable, the mark M does not need to have the same potential as the substrate 2, and it is sufficient that the difference in potential be found once in advance from a writing result, and thereafter the difference be fed back to perform writing.

During writing, the voltage applied to the potential regulation member 16, the substrate, or both can be changed, and this may be used as a dynamic focus function to perform focus adjustment. The adjustment range of the application voltage is a range in which the charging tendency does not change. The adjustment range of the application voltage is, for example, a range in which the position shift $\Delta x$ in the graph illustrated in FIG. 9 becomes less than or equal to a predetermined value (the size of the charging effect correction mesh), such as a range in which, for example, $\Delta x=0$ is achieved.

Irradiation position shifts due to charging phenomena do not happen only to electron beam writing apparatuses. The present invention can be applied to a charged particle beam irradiation apparatus that uses a result obtained by irradiating a target position with a charged particle beam, the charged particle beam apparatus being, for example, an inspection apparatus that inspects a pattern using a charged particle beam such as an electron beam.

Although the present invention has been described in detail by way of the specific modes, it is apparent for those skilled in the art that various changes can be made without departing from the spirit and scope of the present invention.

The present application is based on Japanese Patent Application No. 2020-083979 filed on May 12, 2020, the entire contents of which are incorporated herein by reference.

REFERENCE SIGNS LIST 1 electronic column
2 substrate
3 XY stage
4 mirror
5 electron gun
6 electron beam
7 illumination lens
8 first aperture
9 projection lens
10 deflector
11 second aperture
12 objective lens
13 deflector
14 writing space
15 electrostatic lens
16 potential regulation member
21, 140 storage device
30 writing control unit
31 pattern density distribution calculation unit
32 dose distribution calculation unit 33 irradiation amount distribution calculation unit
34 fogging-electron-amount distribution calculation unit
35 charge amount distribution calculation unit
36 writing elapsed-time arithmetic unit
37 cumulative time arithmetic unit
38 position shift distribution calculation unit
39 application voltage setting unit
41 shot data generation unit
42 position shift correction unit
43 shaping deflector control unit
44 objective deflector control unit
45 stage position detection unit
46 stage control unit
100 writing apparatus
150 voltage control circuit

The invention claimed is:

1. A charged particle beam writing method in which a charged particle beam is deflected by a deflector, focusing is performed by an objective lens, and a pattern is written on a substrate on a stage, the charged particle beam writing method comprising:

virtually dividing a writing region of the substrate so as to have a predetermined mesh size and calculating a pattern density distribution representing an arrangement ratio of the pattern for each mesh region;

calculating a dose distribution representing a dose for each mesh region using the pattern density distribution;

calculating an irradiation amount distribution of the charged particle beam irradiated to the substrate using the pattern density distribution and the dose distribution;

calculating a fogging charged particle amount distribution by convolving a distribution function for fogging charged particles with the irradiation amount distribution;

calculating a charge amount distribution due to direct charge using the pattern density distribution, the dose distribution, and the irradiation amount distribution, and calculating a charge amount distribution due to fogging charge using the fogging charged particle amount distribution;

calculating a first position shift of a writing position based on the charge amount distribution due to direct charge and the charge amount distribution due to fogging charge;

applying a predetermined voltage to at least one of the substrate and a potential regulation member such that a potential of a surface of the substrate becomes higher than a potential of a bottom surface of the potential regulation member arranged at a position facing the substrate; and irradiating a corrected irradiation position based on the first position shift with the charged particle beam, wherein the predetermined voltage is obtained in advance based on a relationship between an application voltage to at least one of the substrate and the potential regulation member and a second position shift of the writing position, which is caused by a shift of a center of a low energy fogging charged particle amount distribution, so that the second position shift is smaller than a predetermined value, and wherein the low energy fogging charged particle is a secondary charged particle generated by irradiation of the charged particle beam onto the substrate and deposited onto the substrate.

2. The charged particle beam writing method according to claim 1, wherein the substrate is caused to have a positive potential.

3. The charged particle beam writing method according to claim 2, wherein a potential of a mark for calibration is made equal to that of the substrate, the mark being provided on the stage.

4. The charged particle beam writing method according to claim 1, wherein the bottom surface of the potential regulation member is caused to have a negative potential.

5. The charged particle beam writing method according to claim 1, wherein focus adjustment is performed on the charged particle beam by controlling the voltage applied to at least one of the substrate or the potential regulation member.

6. A charged particle beam writing apparatus that causes a deflector to deflect a charged particle beam, performs focusing using an objective lens, and writes a pattern on a substrate on a stage, the charged particle beam writing apparatus comprising:

a discharger discharging the charged particle beam;

a pattern density distribution calculator virtually dividing a writing region of the substrate in a mesh-like manner and calculating a pattern density distribution representing an arrangement ratio of the pattern for each mesh region;

a dose distribution calculator calculating a dose distribution representing a dose for each mesh region using the pattern density distribution;

an irradiation amount distribution calculator calculating an irradiation amount distribution of the charged particle beam discharged from the discharger and irradiated to the substrate using the pattern density distribution and the dose distribution;

a fogging charged particle amount distribution calculator calculating a fogging charged particle amount distribution by convolving a distribution function for fogging charged particles with the irradiation amount distribution;

a charge amount distribution calculator calculating a charge amount distribution due to direct charge using the pattern density distribution, the dose distribution, and the irradiation amount distribution, and calculating a charge amount distribution due to fogging charge using the fogging charged particle amount distribution;

a position shift distribution calculator calculating, for writing positions, a first position shift of each writing position based on the charge amount distribution due to direct charge and the charge amount distribution due to fogging charge;

a potential regulation member that is arranged at a position facing the substrate and is controlled to have a predetermined potential;

a voltage control circuit applying a predetermined voltage to at least one of the substrate and the potential regulation member such that a potential of a surface of the substrate becomes higher than a potential of a bottom surface of the potential regulation member;

a writer irradiating a corrected irradiation position based on the first position shift with the charged particle beam in a state where an electric field is formed; and a storage device storing the predetermined voltage as application voltage information, the predetermined voltage being obtained in advance based on a relationship between an application voltage to at least one of the substrate and the potential regulation member and a second position shift of the writing position, which is caused by a shift of a center of a low energy fogging charged particle amount distribution, so that the second position shift is smaller than a predetermined value, wherein the low energy fogging charged particle is a secondary charged particle generated by irradiation of the charged particle beam onto the substrate and deposited onto the substrate.

7. The charged particle beam writing apparatus according to claim 6, wherein the voltage control circuit applies a positive potential to the substrate, and a potential of a mark for calibration is set to be equal to that of the substrate, the mark being provided on the stage.

* * * * *